(12) United States Patent
Frost et al.

(10) Patent No.: US 8,445,086 B2
(45) Date of Patent: May 21, 2013

(54) POLYMER COMPOSITIONS AND ARTICLES HAVING IMPROVED REHEAT CHARACTERISTICS

(75) Inventors: Mark Frost, Ashford-in-the-water (GB); Mark Rule, Roswell, GA (US)

(73) Assignee: Colormatrix Holdings, Inc., Wilmington, DE (US)

( * ) Notice: Subject to any disclaimer, the term of this patent is extended or adjusted under 35 U.S.C. 154(b) by 761 days.

(21) Appl. No.: 12/519,444

(22) PCT Filed: Dec. 19, 2007

(86) PCT No.: PCT/GB2007/004893
§ 371 (c)(1),
(2), (4) Date: Feb. 17, 2010

(87) PCT Pub. No.: WO2008/078078
PCT Pub. Date: Jul. 3, 2008

(65) Prior Publication Data
US 2010/0159179 A1    Jun. 24, 2010

Related U.S. Application Data

(60) Provisional application No. 60/876,562, filed on Dec. 22, 2006.

(51) Int. Cl.
*B29D 22/00* (2006.01)

(52) U.S. Cl.
USPC ..................................... 428/35.7; 428/36.92

(58) Field of Classification Search
USPC ................................. 428/35.7, 36.92; 526/76
See application file for complete search history.

(56) References Cited

U.S. PATENT DOCUMENTS

| | | | | |
|---|---|---|---|---|
| 8,211,983 B2* | 7/2012 | Jarvis et al. | ................... | 525/279 |
| 2006/0222795 A1 | 10/2006 | Howell et al. | | |
| 2007/0203279 A1* | 8/2007 | Jarvis et al. | ................... | 524/413 |
| 2009/0306313 A1* | 12/2009 | Nichols | ........................... | 526/75 |
| 2011/0015325 A1* | 1/2011 | Jarvis et al. | ................... | 524/408 |
| 2012/0225986 A1* | 9/2012 | Jarvis et al. | ................... | 524/404 |

FOREIGN PATENT DOCUMENTS

| | | |
|---|---|---|
| CA | 2 585 142 | 5/2006 |
| WO | WO 2005/095516 | 10/2005 |
| WO | WO 2005/103110 | 11/2005 |

OTHER PUBLICATIONS

Skoric, B. et al., "Microstructural studies of TiN coatings prepared by PVD and IBAD" Surface Science, North-Holland Publishing Co., Amsterdam, Netherlands, vol. 566-568, Sep. 20, 2004, pp. 40-44 XP004562262.

Hakansson, G. et al. "Microstructures of TiN films grown by various physical vapour disposition techniques", Surf Coat Technol: Surface & Coatings Technology, Oct. 1, 1991, vol. 48, No. 1, pp. 51-67, XP002474712.

* cited by examiner

*Primary Examiner* — N. Edwards
(74) *Attorney, Agent, or Firm* — Fay Sharpe LLP

(57) ABSTRACT

Polymer compositions, for example of polyethyleneterephthalate bottles or preforms, include a reheat additive which has reducing transmission/increasing absorbance across the IR region as the wavelength increases. The reheat additive may be a titanium nitride, made by a plasma vapor deposition technique. Advantageously, the material may be used at a lower level than hitherto known materials or may be used at the same levels as hitherto but provide a greater reheat effect. Example 3a shown in the figure illustrates the absorbance of a preferred material.

17 Claims, 6 Drawing Sheets

POLYMER COMPOSITIONS AND ARTICLES HAVING IMPROVED REHEAT CHARACTERISTICS

This application claims priority to PCT Application No. PCT/GB2007/004893, filed Dec. 19, 2007, and U.S. Provisional Application Ser. No. 60/876,562, filed Dec. 22, 2006.

FIELD OF INVENTION

This invention relates to polymer compositions and particularly, although not exclusively, relates to compositions which have improved reheat characteristics and may be used in reheat blow moulding or other hot forming processes. Preferred embodiments relate to the manufacture of containers, for example beverage containers.

BACKGROUND OF INVENTION

Polymers are often used in producing preforms (parisons) which are heated with infrared heating lamps prior to being blow-moulded into articles, including liquid containers such as beverage bottles and the like. The heat lamps used for reheating polymer preforms (parisons) for the commercial manufacture of liquid containers such as beverage bottles are typically quartz lamps having a broad light emission spectrum from 500 nm to greater than 1500 nm, i.e. infrared heating lamps. The maximum light emission from these lamps occurs typically in the range of about 1100 to 1300 nm. Polyester, especially polyethylene terephthalate ("PET"), absorbs poorly in the region between 500 to 1400 nm. Thus, in order to speed up the reheat step in bottle production, or to reduce the amount of energy required for reheat, agents which absorb light in the region between 700 to 1300 nm can be added to the polyester polymer as reheat additives.

A variety of black and grey body absorbing compounds have previously been used as reheat agents to improve the range of heating characteristics of polyester under infrared heating lamps. These compounds are typically black iron oxide, elemental antimony, black carbon and copper chromite. The term "black carbon" includes graphite, any form of carbon black, charcoal, activated carbon and the like. However, these materials all have greater intrinsic absorptivity in the visible spectrum between 400 and 700 nm than in the infrared region between 700 and 1400 nm. This makes these materials appear inefficient when the visible impact versus infrared absorptivity is considered. High levels of reheat cannot be achieved without the severe darkening of the polymer. While the impact of these materials on the visual appearance of preforms can be reduced by using relatively large particles of the additives, they inherently cannot exhibit greater absorptivity in the infrared region of the electromagnetic spectrum relative to the visible region of the spectrum. Therefore, the amount of absorbing materials that can be added to a polymer is limited by the impact of those materials on polymer visual properties such as transparency. This is particularly pertinent if the preforms are to be used to manufacture liquid containers such as beverage bottles, especially for use in containing mineral water, where high transparency and an absence of colour are considered essential. Transparency is usually represented as "L*" in the CIELAB system, with 100 being the highest and 0 being the darkest. Generally, darker coloured reheat agents can be added in only very small quantities because of their negative impact on L*.

WO2005/095516 (Colormatrix) discloses a number of inorganic additives that intrinsically possess greater absorption in the near infrared region relative to absorption in the visible spectrum. Additives disclosed include titanium nitride, lanthanum boride, and indium tin oxide (ITO).

US2006/016146 (Eastman) discloses polyester polymer and copolymer compositions containing titanium nitride particles.

However, there are still limitations with the materials described in the prior art. More particularly, it is found that preforms which include titanium nitride as described in the aforementioned patent applications have reducing absorbances as the wavelength increases from 700 nm. The more the absorbance decreases as the wavelength increases from 700 nm, then the more titanium nitride will be required to be included in a preform to achieve a desired level of reheat. However, increasing the level of titanium nitride will detrimentally reduce the clarity and L* of the preform.

It is an object of the present invention to address problems associated with the reheat characteristics of polymer compositions.

SUMMARY OF INVENTION

According to a first aspect of the invention, there is provided an article comprising a polymer composition which includes a reheat additive wherein said article includes at least one of the following properties:

(A) the ratio defined as the absorbance at 750 nm divided by the absorbance at 700 nm is greater than 1;
(B) the ratio defined as the absorbance at 800 nm divided by the absorbance at 700 nm is greater than 1;
(C) the ratio defined as the absorbance at 850 nm divided by the absorbance at 700 nm is greater than 1;
(D) the ratio defined as the absorbance at 900 nm divided by the absorbance at 700 nm is greater than 1;
(E) the ratio defined as the absorbance at 950 nm divided by the absorbance at 700 nm is greater than 1;
(F) the ratio defined as the absorbance at 1000 nm divided by the absorbance at 700 nm is greater than 1;
(G) the ratio defined as the absorbance at 1050 nm divided by the absorbance at 700 nm is greater than 1;
(H) the ratio defined as the absorbance at 1100 nm divided by the absorbance at 700 nm is greater than 1;
(I) the ratio defined as the transmission at 1000 nm divided by the transmission at 500 nm is less than 1.04.
(J) the % transmission at 1000 nm minus the % transmission at 500 nm is less than 2.75%.

Suitably, said article includes at least 1, preferably at least 2, more preferably at least 3, especially each of properties (E) to (H).

Suitably, said article includes at least 2, preferably at least 4, more preferably at least 6, especially each of the properties (A) to (H).

Preferably, said article includes property (H).

The ratio for property (H) may be greater than 1.01, suitably greater than 1.03, preferably greater than 1.07, more preferably greater than 1.08.

The ratio for property (G) may be greater than 1.01, suitably greater than 1.03, preferably greater than 1.05, more preferably greater than 1.07.

For each of properties (A) to (H), the ratio may be less than 10, less than 5, less than 3, less than 2 or less than 1.5, or less than 1.3.

The ratio for property (H) is preferably greater than the ratio for each of properties (A) to (D).

The ratio for property (G) is preferably greater than the ratio for each of properties (A) to (D).

The ratio for property (A) may be lower than the ratio for each of properties (B) to (H).

Preferably, the ratio for property (A) is lower than the ratio for property (B) which is lower than the ratio for property (C) which is lower than the ratio for property (D). Additionally, preferably, the ratio for property (D) is lower than the ratio for property (E) which is lower than the ratio for property (F) which is lower than the ratio for property (G).

Preferably, the article includes property (I).

Preferably, the article includes property (J).

Preferably, said article includes each of properties (A) to (J).

The ratio of the absorbance in the region 701 nm-1100 nm divided by the absorbance in the region 450-700 nm may be at least 1.1, suitably at least 1.15, preferably at least 1.2, more preferably at least 1.25, especially at least 1.3. Said ratio may in even more preferred embodiments be at least 1.35 or even at least 1.39. The ratio may be less than 1.8 or less than 1.6. The ratio may be determined by calculating the area under a % absorbance vs wavelength plot (the area being bounded at one extreme by the 0% absorbance line) for the 701-1100 nm range and dividing that area by the area under the plot for the 450-700 nm range.

Preferably, the ratio defined as the absorbance at 1050 nm divided by the absorbance at 1000 nm is greater than 1; and preferably the ratio defined as the absorbance at 1100 nm divided by the absorbance at 1150 nm is greater than 1. Preferably, the ratio defined as the absorbance at 1200 nm divided by the absorbance at 1100 nm is greater than 1.

The properties described herein may unless otherwise stated be measured at any selected position on the article. A sample to be tested may be removed from the bulk of the article for testing.

To assess absorbance and/or transmission and therefore calculate the values in (A) to (J) a sample from the article may be tested using a Variam Cary 500 UV-VIS-NIR spectrophotometer and the absorbance at the specified wavelengths recorded. The figure may be converted into transmission by the equation:

% transmission=1/absorbance

The article may be any article which is arranged to be heated to change its shape and/or form or which has been heated to change its shape and/or form. The article may be any article which includes a reheat additive to improve its heat uptake relative to the heat uptake in the absence of said additive. In a preferred embodiment, said article is for packaging, for example it is a receptacle, or a preform for an article of packaging.

Said article may be a bottle or a preform for a bottle. More preferably, said article is a bottle, especially a blow moulded bottle. Said bottle may be a beverage bottle, for example for carbonated soft drinks.

Said article may have an L*, measured on the CIELab scale, of at least 45, suitably at least 50, preferably at least 60, more preferably at least 65, especially at least 70.

Said article preferably has a wall having a thickness in the range 0.2 mm to 5 mm. Preferably, the values referred to in (A) to (J) and the L* values are measured on a wall of the article having such a thickness.

When said article is a bottle, as is preferred, said bottle may have a wall thickness of in the range 0.25 mm to 0.35 mm.

Said article may comprise a single layer or multiple layers. For example, the article may comprise a multi-layered bottle. In this case, the article may have the properties described herein. Alternatively, one layer of the multiple layered article may have the properties described herein in (A) to (J) and elsewhere herein for said article. This is described further in the eighth aspect hereinafter.

Preferably, the article exhibits the properties described over a substantial area of the article, for example over at least 50%, preferably at least 75%, more preferably at least 90% of the area of the article, for example, bottle.

Said article is preferably a substantially clear, colourless article, for example bottle. Coloured articles may have features described according to the ninth aspect hereinafter.

Said reheat additive preferably includes titanium moieties and nitrogen moieties. Said reheat additive suitably comprises a compound which includes titanium and nitrogen moieties, suitably wherein the ratio of the number of atoms of titanium to the number of atoms of nitrogen in the compound is at least 1 and, preferably, is greater than 1. The ratio of the number of atoms of titanium to the number of atoms of nitrogen may be less than 2.2, preferably less than 2. The ratio may be less than 1.9 or less than 1.8. Said reheat additive suitably comprises greater than 90 wt %, preferably greater than 95 wt %, more preferably greater than 98 wt % of titanium and nitrogen moieties. Preferably, said reheat additive consists essentially of titanium and nitrogen moieties. Thus, preferably said reheat additive is a titanium nitride.

Said reheat additive preferably includes particles having at least one dimension less than 10 microns, preferably less than 1 micron and more preferably less than 100 nm.

Suitably at least 90%, (preferably at least 95%, more preferably at least 99%, especially about 100%) of the particles or said reheat additive have at least one dimension which is less than 10 microns, preferably less than 1 micron, more preferably less than 500 nm, especially less than 100 nm.

The reheat additive may be of such a particle size that, when present in the polymer composition, it is substantially optically invisible. For example, substantially all of the particles of the reheat additive may have a particle size which is below the critical wavelength of visible light.

The reheat additive may have uneven or slanted absorption characteristics across the visible region of the spectrum possessing significant absorption minima or maxima. This may be desirable for the production of coloured bottles. An additive which may impart a blue colour to the polymer composition may be especially desirable as it can act not only to improve the reheat profile of the polymer composition, but also to colour the article. Polymers, particularly polyesters such as poly(ethylene terephthalate), are known to yellow upon exposure to elevated temperatures. Indeed poly(ethylene terephthalate) yellows as it is being manufactured. In some cases, a toner may be added to the polyester to adjust its colour from a yellow back to a neutral shade. These toners are thus usually colorants which impart a blue shade, a typical example being cobalt acetate. Therefore, reheat additives which impart a blue shade to the polymer composition, may also make good toners and may be especially desirable.

Said article may have absorbance characteristics as described in any statement herein and, additionally, may have an absorbance at 475 nm which is less than the absorbance at 450 nm. The absorbance at 475 nm is preferably less than the absorbance at both 425 nm and 450 nm. The absorbance at 475 nm is more preferably less than the absorbance at each of 425 nm, 450 nm and 550 nm. The absorbance at 475 nm is most preferably less than the absorbance at each of 425 nm, 450 nm, 550 nm and 575 nm.

Advantageously, the polymer composition may include less reheat additive, for example titanium nitride, than hitherto required to obtain a specified level of reheat due to the absorbance characteristics of the reheat additive in the infrared region.

The term "ppm" used herein refers to "parts per million".

Said polymer composition may include at least 0.01 ppm, suitably at least 0.1 ppm, preferably at least 1 ppm, more preferably at least 2 ppm, even more preferably at least 4 ppm of said reheat additive based on the total weight of said polymer composition. Said polymer composition may include less than 200 ppm, preferably less than 100 ppm, more preferably less than 50 ppm, especially less than 20 ppm of said reheat additive based on the weight of said polymer composition. Typically, said composition may include 4 to 10 ppm of said reheat additive.

The ratio of the total weight of said polymer composition divided by the weight of said reheat additive may be in the range $2 \times 10^5$ to $10^7$.

Said polymer composition suitably comprises a polymeric material and preferably comprises a thermoplastic polymeric material. Preferred thermoplastic polymeric materials are ones usable/used for injection moulding of articles such as container preforms and the like. Preferably, the polymeric material is selected from one or more of the following groups of polymers: polyesters, polycarbonates, polyamides, polyolefins, polystyrenes, vinyl polymers, acrylic polymers and copolymers and blends thereof. Preferred polymers are polyesters, polypropylene and oriented polypropylene. Especially preferred polymeric materials are polyesters such as poly (ethylene terephthalate) or a copolymer thereof.

The backbone of the polymeric material suitably includes repeating terephthalate or naphthalate units.

Said polymeric material is preferably a polyester polymer. Examples of suitable polyester polymers include one or more of: PET, polyethylene naphthalate (PEN), poly(1,4-cyclo-hexylenedimethylene terephthalate) (PETG), copoly (1,4-cyclohexylene dimenthylene/ethylene terephthalate-co-isophthalate) (PCTA), poly(ethylene terephthalate-co-isophthalate) (PETA) and their blends or their copolymers.

The reference to a polyester also extends to polyester derivatives, including polyether esters, polyester amides and polyetherester amides.

Said polymeric material is preferably a polyethylene terephthalate. Copolyesters of polyethylene terephthalate which contain repeat units from at least 85 mole % terephthalic acid and at least 85 mole % of ethylene glycol may be used. Dicarboxylic acids which can be included, along with terephthalic acid, are exemplified by phthalic acid, isophthalic acid, naphthalene-2,6-dicarboxylic acid, cyclohexanedicarboxylic acid, cyclohexanediacetic acid, diphenyl-4,4'-dicarboxylic acid, succinic acid, glutaric acid, adipic acid, azelaic acid and sebacic acid. Other diols which may be incorporated in the copolyesters, in addition to ethylene glycol, include diethylene glycol, triethylene glycol, 1,4-cyclohexanedimethanol, propane-1,3-diol, butane-1,4-diol, pentane-1,5-diol, hexane-1,6-diol, 3-methylpentane-2,4-diol, 2-methyl pentane-1,4-diol, 2,2,4-trimethylpentane-1,3-diol, 2-ethylhexane-1,3-diol, 2,2-diethylpropane-1,3-diol, hexane-1,3-diol, 1,4-di(hydroxyethoxy)-benzene, 2,2-bis-(4-hydroxycyclohexyl)-propane, 2,4-dihydroxy-1,1,3,3-tetramethyl-cyclobutane, 2,2-bis-(3-hydroxyethoxyphenyl)-propane, and 2,2-bis-(4-hydroxypropoxyphenyl)-propane.

Said polymeric material may include at least 0.01 ppm, suitably at least 0.1 ppm, preferably at least 1 ppm, more preferably at least 2 ppm, even more preferably at least 4 ppm of said reheat additive based on the total weight of said polymer composition. Said polymeric material may include less than 200 ppm, preferably less than 100 ppm, more preferably less than 50 ppm, especially less than 30 ppm of said reheat additive based on the weight of said polymeric material.

The ratio of the total weight of said polymeric material divided by the weight of said reheat additive may be in the range $2 \times 10^5$ to $10^7$.

The polymer composition may include other functional additives for improving/adjusting its properties. For example slip property modifiers, acetaldehyde scavengers, inherent viscosity modifiers, gas barrier agents (e.g. AMOSORB (Trademark)), flame retardancy agents, anti-microbial additives, surface finish modifiers and conductivity modifiers may be included.

The sum of the amounts of further functional additives suitably comprises less than 10 wt %, preferably less than 2 wt %, more preferably less than 1 wt % of said polymer composition.

It may in general be relatively routine to determine whether an article has the properties, for example, the absorbance described herein. For example, when the article is a bottle, as is preferred, a sample of the bottle (e.g. of its side wall) may be detached and tested on a spectrophotometer to assess, for example, its absorbance.

A reheat additive incorporated into the article of the first aspect may be made by a physical vapour deposition (PVD) technique. The technique may be selected from magnetron sputtering, vacuum evaporation, cathodic arc evaporation, ion-plating, ion-beam sputtering and pulsed laser ablation. The reheat additive is suitably prepared from a coating flux created as a vapour from a solid source under a partial vacuum. Said reheat additive is suitably prepared in a sputtering process.

When said reheat additive comprises titanium and nitrogen moieties as is preferred, a method for making the reheat additive may comprise:
 (a) arranging a substrate comprising titanium moieties, for example having a titanium-containing outer surface, in a vacuum chamber;
 (b) introducing a nitrogen-containing gas mixture into the chamber;
 (c) causing titanium atoms to be sputtered from said substrate;
 (d) arranging a workpiece in the chamber on which titanium and nitrogen moieties may condense for providing said reheat additive.

Said titanium and nitrogen moieties are preferably part of a film on said workpiece.

Said substrate may comprise substantially pure titanium. Said gas mixture may comprise nitrogen and an inert, for example nobel, gas, suitably argon.

In the method, a plasma or partially ionised gas may be caused to form in the chamber.

The flow rate of nitrogen may be controlled to adjust properties of the reheat additive prepared.

The reheat additive prepared may have a structure selected from porous columnar, dense columnar and fully dense. It is preferably dense columnar.

The stoichiometry and/or nature of the reheat additive may be adjusted by varying the nitrogen flow rate and/or the energy of ions approaching the substrate. The latter may be done by applying a negative bias voltage to the substrate.

In a preferred embodiment, said workpiece may comprise a plastics, for example, thermoplastics material. It may comprise any of the thermoplastic materials referred to herein. It preferably comprises a thermoplastics material included in said polymer composition of the article of the first aspect. It preferably comprises a polyester, for example a PET.

When said reheat additive is formed on a workpiece, it may either be removed from the workpiece or the workpiece together with the associated reheat additive may be incorporated into the polymer composition of the first aspect. In either case, the material on the workpiece which is suitably a film is comminuted (either when in situ on the workpiece or having been removed therefrom) suitably to define reheat additive having particles sizes described herein.

According to a second aspect of the invention, there is provided a method of making a reheat additive for incorporation into a polymer composition for an article as described according to the first aspect, the method comprising a PVD technique and/or being as described above. Preferably, the method comprises making a film as a precursor of said reheat additive and comminuting the film to produce a mass of reheat additive having particle sizes referred to herein.

The invention extends to a reheat additive made in a method according to the second aspect.

According to a third aspect, there is provided a reheat additive for incorporation into a polymer composition, said additive comprising titanium moieties and nitride moieties (preferably wherein the number of atoms of titanium moieties is greater than the number of atoms of nitrogen moieties) having a structure selected from porous columnar, dense columnar and fully dense and/or being made by a PVD technique, wherein said additive includes particles having at least one dimension which is less than 10 microns.

According to a fourth aspect of the invention, there is provided a method of making a formulation for incorporation into a polymer composition for an article as described according to the first aspect, the method comprising:
(a) selecting a reheat additive made as described according to the second aspect or being as described in the third aspect;
(b) dispersing the reheat additive in a carrier.

Said formulation may comprise a concentrated form, for example a masterbatch, comprising solid material for mixing with a polymeric material or be in the form of a suspension. In such concentrated forms, the wt % of reheat additive (e.g. comprising titanium and nitrogen moieties) may be less than 75 wt %, preferably less than 55 wt % of the concentrated form; but preferably makes up at least 5 wt % of the concentrated form. When a liquid dispersion is provided, the wt % of reheat additive (e.g. comprising titanium and nitrogen moieties) in the dispersion may be in the range 5 to 50 wt %, preferably 5 to 20 wt %. In a solid masterbatch, the wt % of reheat additive (eg comprising titanium and nitrogen moieties) may be in the range 5 to 75 wt %, preferably 8 to 30 wt %.

In one embodiment, the formulation may be made by mixing the dry additive or additives in the form of a powder with a liquid organic carrier, typically in a range of from about 1 to about 85 wt %, more usually in the range of from about 30 to about 50 wt %. The resulting formulation can then be added to the polymeric material in ranges from about 0.0001% by weight to about 7% by weight, for example, from 0.01% by weight up to about 5% by weight, based upon the weight of polymeric material used.

It may not be desirable to use higher concentrations of the additive as this may interfere with the properties of the polymeric material.

When the formulation includes a liquid carrier, the liquid carrier is generally an inert material, such as a hydrocarbon oil, an ester, an alcohol, or a mixture of two or more thereof. The liquid carrier is suitably selected to be non-toxic, to have good compatibility with the polymeric material and is preferably also compatible with the other components to be included in the composition. Typical carriers include hydrocarbons, hydrocarbon mixtures, alcohols, esters and mixtures of two or more thereof. Preferably the liquid carrier is an oil based vehicle.

Preferably, after dispersion in said carrier said reheat additive (e.g. titanium nitride) has particle sizes referred to herein.

According to a fifth aspect of the invention, there is provided a formulation (for example as described according to the fourth aspect), for incorporation into a polymer composition for an article as described according to the first aspect, the formulation comprising:
(a) a reheat additive made as described according to the second aspect or being as described in the third aspect;
(b) a carrier;
wherein the reheat additive is dispersed in the carrier.

The carrier and/or reheat additive may have any feature described herein mutatis mutandis. In a preferred embodiment said formulation comprises a titanium nitride wherein the ratio of the number of atoms of titanium to the number of atoms of nitrogen is greater than 1 and the titanium nitride includes particles having at least one dimension which is less than 100 nm in combination with a polymeric carrier to define a solid masterbatch or said titanium nitride is dispersed in a liquid (e.g. an organic liquid).

According to a sixth aspect of the invention, there is provided a method of making a polymer composition for an article as described according to the first aspect, the method comprising:
(a) selecting a formulation according to the fifth aspect;
(b) contacting said formulation with a polymeric material as described according to the first aspect, in order to prepare a polymer composition in accordance with the first aspect.

According to a seventh aspect, there is provided a polymer composition for an article as described according to the first aspect, the polymer composition, when moulded into a 3 mm thickness plaque, having at least one of properties (A) to (J) according to the first aspect. Suitably, the properties attributed to the article of the first aspect may be applied to the polymer composition when moulded into said plaque, mutatis mutandis.

According to an eighth aspect of the invention, there is provided a layer of an article, for example a bottle, wherein said layer has at least one of properties (A) to (J) according to the first aspect. Suitably, the properties attributed to the article of the first aspect may be applied to the layer of the eighth aspect, mutatis mutandis.

Multiple-layered bottles (e.g. comprising 3 or more layers) can readily be treated to isolated one layer, for example a layer comprising a polymer composition as described according to the first aspect. Such an isolated layer may be tested as described according to the first aspect.

In some cases, for example in green bottles, the absorbance at 700 nm may be relatively high, although in general absorbance due to the dyes/pigments used will fall away as the wavelength increases from 700 nm. Thus, in a ninth aspect of the invention there is provided an article (or layer) comprising a polymer composition which includes a reheat additive wherein said article or layer includes at least one of the following properties:
(AA) the ratio defined as the absorbance at 900 nm divided by the absorbance at 850 nm is greater than 1;
(BB) the ratio defined as the absorbance at 950 nm divided by the absorbance at 850 nm is greater than 1;
(CC) the ratio define as the absorbance at 1000 nm divided by the absorbance at 850 nm is greater than 1;
(DD) the ratio defined as the absorbance at 1050 nm divided by the absorbance at 850 nm is greater than 1;

(EE) the ratio defined as the absorbance at 1100 nm divided by the absorbance at 850 nm is greater than 1.

The ratio of the absorbance in the region 851 nm-1100 nm divided by the absorbance in the region 450-850 nm may be at least 1.1, suitably at least 1.15, preferably at least 1.2, more preferably at least 1.25, especially at least 1.3. Said ratio may in even more preferred embodiments be at least 1.35 or even at least 1.39. The ratio may be less than 1.8 or less than 1.6. The ratio may be determined by calculating the area under a % absorbance vs wavelength plot (the area being bounded at one extreme by the 0% absorbance line) for the 851-1100 nm range and dividing that area by the area under the plot for the 450-850 nm range.

According to a tenth aspect of the invention, there is provided a method of making a preform for a receptacle, for example a bottle, the method comprising:
(a) selecting a polymer composition according to the sixth aspect;
(b) injection moulding the preform to define said receptacle.

According to an eleventh aspect, the invention provides a method of making an article of the first aspect in the form of a receptacle, for example a bottle, the method comprising: selecting a preform for said receptacle, wherein said preform comprises a composition according to the seventh aspect or is made in a method according to the tenth aspect, and forming said preform into said article, for example by blow moulding.

Any feature of any aspect of any invention or embodiment described herein may be combined with any feature of any aspect of any other invention or embodiment described herein mutatis mutandis.

BRIEF DESCRIPTION OF DRAWINGS

Specific embodiments of the invention will now be described, by way of example, with reference to the accompanying figures in which.

DETAILED DESCRIPTION OF PREFERRED EMBODIMENTS

Reheat additives of titanium nitride were prepared by a physical vapour deposition (PVD) technique known as magnetron sputtering. This is described in detail below.

Sputtering to Produce Titanium Nitride Films

In generally all sputtering processes, a target plate of a material to be deposited is arranged in a vacuum chamber attached to a negative voltage supply. The vacuum chamber is evacuated and then backfilled to the working pressure with (usually) argon. Under the correct conditions of pressure and voltage, a plasma, or partially ionised gas, will be initiated. Essentially, electrons in the plasma are accelerated away from the target (cathode) plate and collide with argon gas atoms with sufficient energy to ionise them. The now positive argon ions are accelerated back towards the cathode and if they strike it with energies greater than the binding energy they will remove or 'sputter' off target atoms, which diffuse across the chamber and condense on a workpiece as a thin film.

In magnetron sputtering, magnets are positioned behind the cathode to help create a denser plasma and increase sputtering rates, compared to a basic sputtering cathode.

With all PVD techniques there are different variants. In the present case, pulsed reactive unbalanced magnetron sputtering was used which involves pulsing the voltage at the target in the 100-350 kHz range, rather than a continuous DC voltage. This may increase the plasma density, improve the stability of the process and produce films with enhanced properties. Additionally, a further process gas was introduced into the chamber along with the argon to form a compound film rather than a metallic film. The reference to 'unbalanced' is a term describing the way the magnetic field in a magnetron is designed. Unbalancing the field leads to greater energy being delivered to the substrate.

Figure 1:
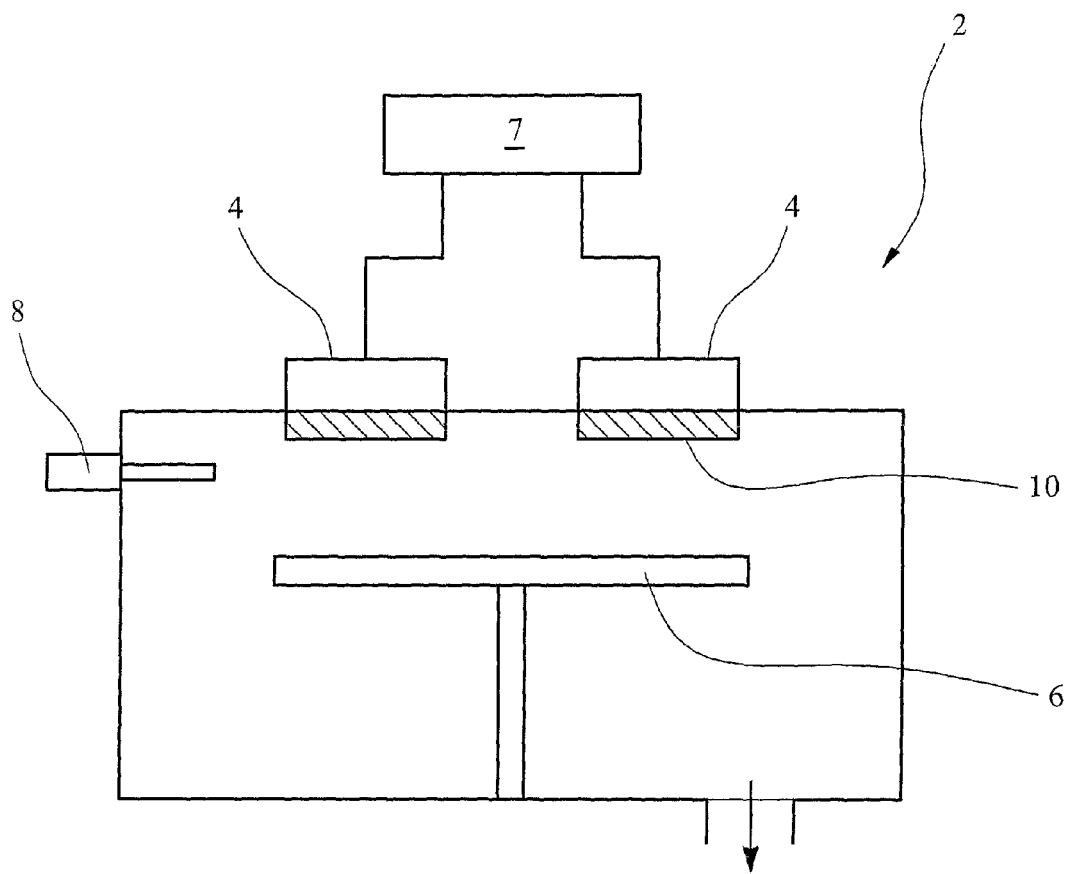
FIG. 1 is a schematic representation of a magnetron sputtering apparatus.

The coatings were deposited in a Teer Coatings Ltd. UDP550 system, shown schematically in FIG. 1. The apparatus 2 has two 300 mm×100 mm magnetrons mounted in the chamber roof in a 'sputter-down' configuration. A substrate sits beneath the magnetrons on a turntable 6, which was rotated at a few rpm throughout the deposition process to improve coating uniformity. The magnetrons were powered by a dual channel pulsed power supply 7. During a reactive sputtering process to deposit TiN, titanium targets 10 (99.5% pure; from Teer Coatings Ltd) were sputtered in an argon/nitrogen atmosphere. The nitrogen flow rate was controlled using an optical emission monitoring (OEM) process 8 (sometimes referred to as plasma emission monitoring—PEM).

The OEM system works by monitoring the strength of an emission line in the characteristic spectrum of the target metal and using this as a control signal.

Initially, the target was sputtered in an argon only atmosphere. A monochromator was tuned into a strong line in the Ti emission spectrum (504 nm). The signal at this stage was taken as the 100% metal signal. The substrate was shuttered to prevent deposition of Ti at this time. Nitrogen gas was then introduced to the chamber. This results in the formation of TiN at the target and, since the sputtering rate of compounds is lower than metals, the strength of the Ti signal falls. An operator may select the level to which the signal is allowed to fall, based on previous experiment, as a percentage of the full metal signal. In the case of TiN, for example, a signal of 50% of the full metal signal will result in a stoichiometric TiN coating and signals greater than that will produce metal rich films.

Once operating conditions have been established, the shutter is opened and the TiN coating is deposited onto the substrate.

The structure and properties of coatings may be controlled by the energy delivered to the growing film.

Unbalanced magnetrons are designed to deliver a high flux of ions to the substrate to help modify film growth. The energy of these ions can be further controlled by applying a negative bias voltage to the substrate. In the present case, a RF (radio frequency—13.56 MHz) supply was used. At this frequency, the electrons can follow the varying voltage, but the slow heavy ions cannot—they only see an offset negative voltage at the substrate and are accelerated by that voltage. Thus, for the TiN coatings on PET described below, the substrates were RF biased to modify their properties and the bias power recorded.

Two sets of experiments were undertaken using the apparatus discussed as described in Examples 1 and 2.

Example 1

In this example, the target was titanium metal, and the substrate was polyethylene terephthalate (PET). Sputtering was undertaken in an argon/nitrogen atmosphere.

The stoichiometry of the titanium nitride prepared in the process was varied by varying the OEM setting over the range 50% (stoichiometric TiN) to 62.5% which produces metal rich TiN. The bias power used in each case was zero. Transmission spectra for the titanium nitride/PET films prepared were produced using an Aquila instrument nkd8000 spectrophotometer with a spectral range 350-1700 nm. Spectra are provided in FIG. 2 which shows that an OEM setting of 60% gives the lowest transmissions (highest absorbance) films and that transmission/absorbance differs significantly as between films prepared using an OEM setting of 50% on the one hand and a setting of 60% on the other hand.

Example 2

The procedure described generally in Example 1 was used except that the OEM was set at 60% in all cases and the bias power was varied to produce four samples detailed in the table below.

| Example No | Bias power (W) |
|---|---|
| 2a | 0 |
| 2b | 20 |
| 2c | 40 |
| 2d | 60 |

Figure 3:
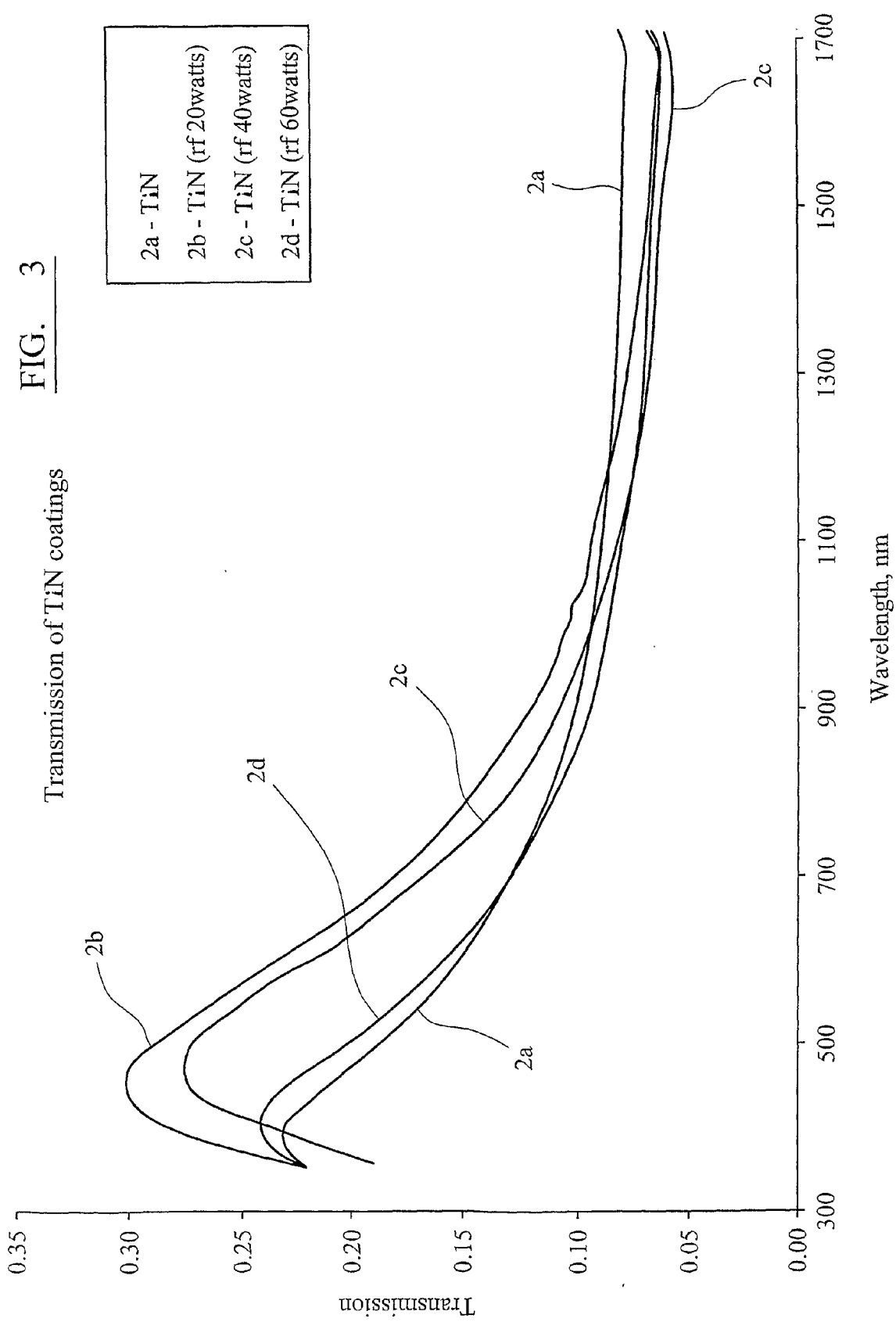
FIG. 3 is a plot of transmission vs. wavelength for TiN coatings at different bias powers.

Transmission spectra for the forms were produced as described in Example 1 as represented in FIG. 3.

Example 3

PET films coated with titanium nitride prepared as described in Example 2 were ground to provide fine particles of titanium nitride/PET which were then added to a PET (Vordian 9921) and injection moulded to produce plaques. Spectra of materials prepared were compared to the spectra of conventional stoichiometric titanium nitrides (i.e. TiN) (prepared by chemical means, not by a sputtering process). Results are discussed below.

Figure 4:
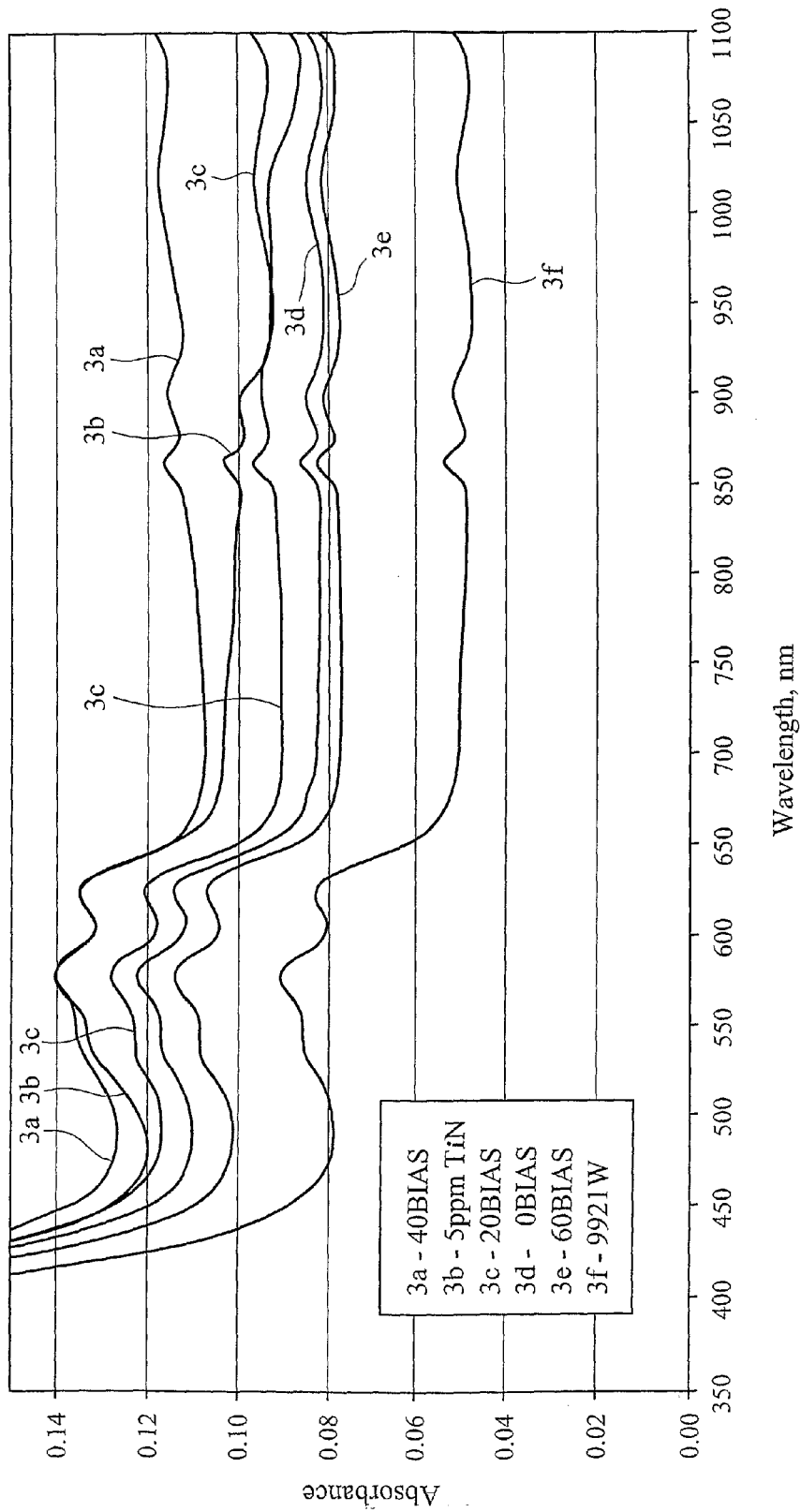
FIG. 4 includes plots of absorbance vs. wavelength for various materials.

Referring to FIG. 4, the following materials are represented on the absorbance vs wavelength spectra.

| Example No | Material |
|---|---|
| 3a | Non-stoichiometric titanium nitride, produced at OEM 60% and 40 bias. |
| 3b | 5 ppm stoichiometric TiN produced by a conventional chemical process. |
| 3c | As per 3a, except produced at 20 bias. |
| 3d | As per 3a, except produced at 0 bias. |
| 3e | As per 3a, except produced at 60 bias. |
| 3f | PET 9921 without any titanium nitride. |

Example 4

The Eg 3a material was compared to other materials detailed below and transmission vs wavelength spectra produced which are provided in FIG. 5.

| Example No | Material |
|---|---|
| 4a | PET 9921 without any titanium nitride |
| 4b | PET 9921 with 3.2 ppm of a stoichiometric titanium nitride produced by a conventional chemical process. |
| 4c | PET 9921 with 7.3 ppm of a stoichiometric titanium nitride produced by a conventional chemical process. |
| 4d | PET 9921 with 14 ppm of a stoichiometric titanium nitride produced by a conventional chemical process. |

Example 5

Figure 6:
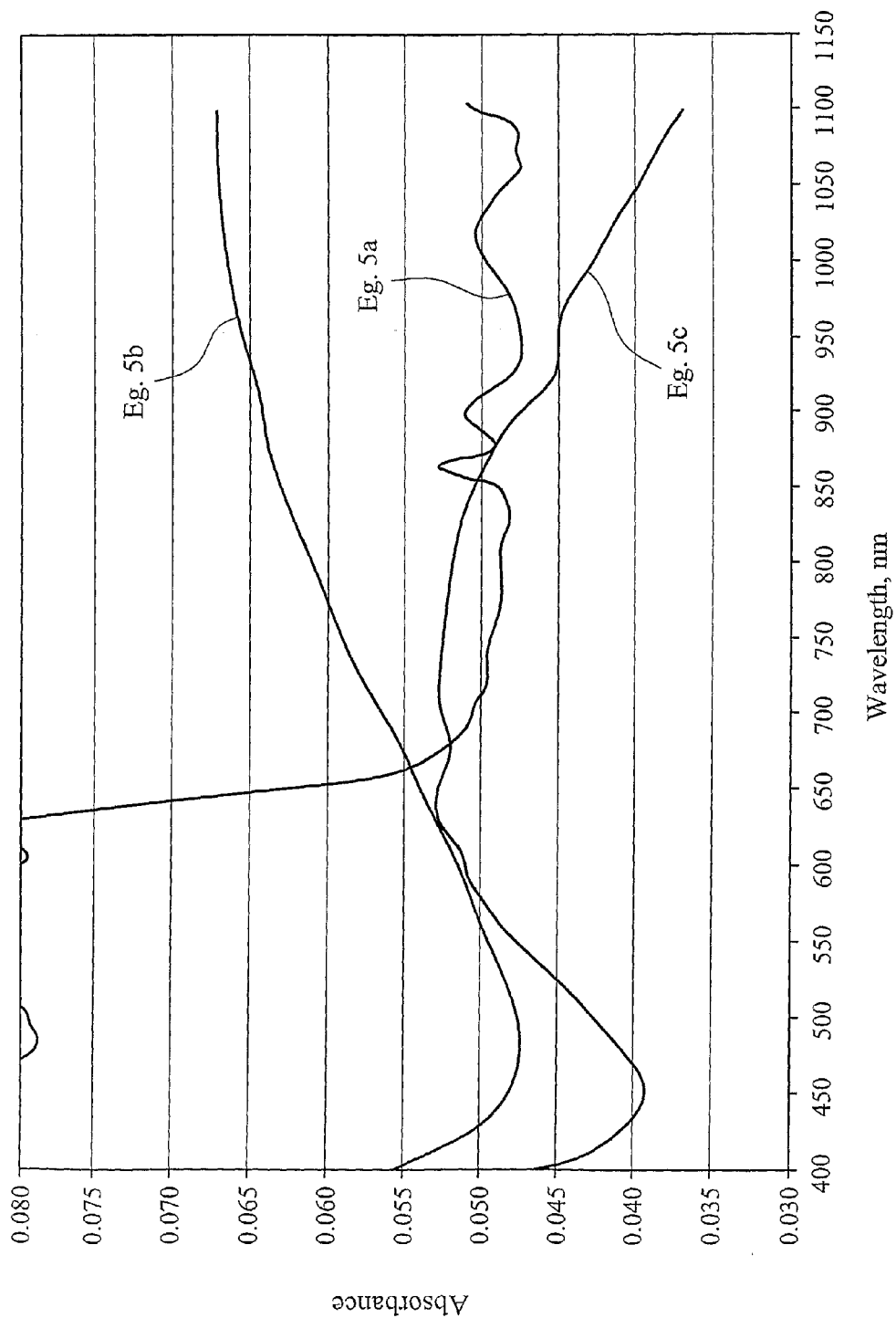
FIG. 6 includes mathematically manipulated plots of absorbance vs. wavelength for selected materials.

FIG. 6 is a graph of absorbance vs wavelength which has been mathematically constructed by subtracting the absorbance due to PET 9921 (Example 5a) from the absorbance of the Example 3a material when incorporated into the PET 9921 as shown in FIG. 4 to give the Example 5b plot. The Example 5c plot is the Example 3b material.

Discussion

Figure 2:
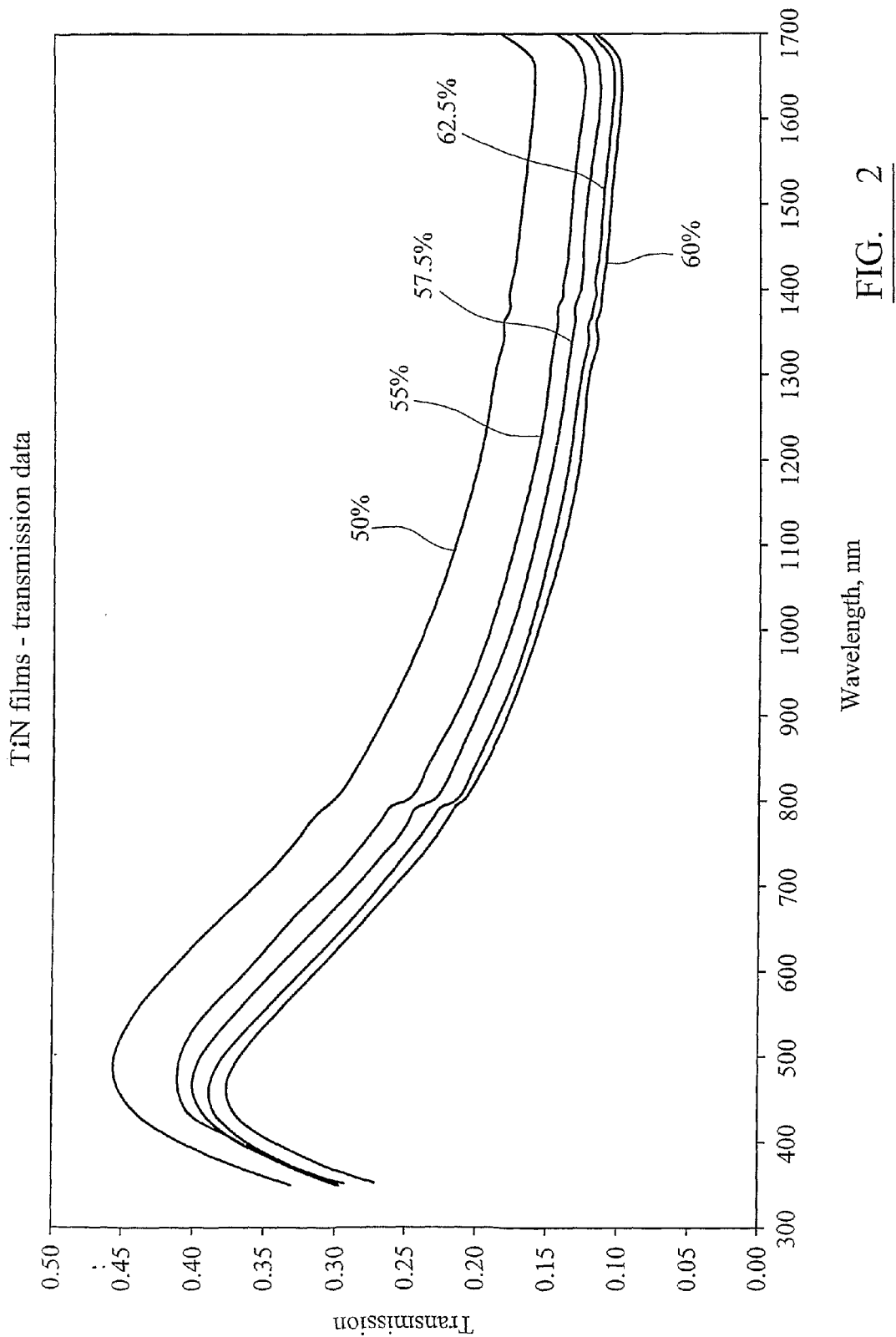
FIG. 2 is a plot of transmission vs. wavelength for TiN coatings prepared in a sputtering process using different nitrogen flow rates.

Referring to FIG. 2, it will be noted that generally as the OEM % increases the transmission goes down and the absorbance goes up in the infra red region of the spectrum, although there appears to be a maximum absorbance at an OEM of about 60%—an increase beyond this appears to cause the absorbance to reduce slightly.

Referring to FIG. 3, it will be noted that absorbance in the IR region is lower for all bias powder compared to that for conventional stoichiometric TiN, with a bias power of 40 watts producing the highest absorbance (lowest transmission) material.

Referring to FIG. 4, it will be noted that the 40 W bias material (Example 3a) has the highest absorbance and, advantageously in general, the absorbance increases as the wavelength increases across the IR region.

Figure 5:
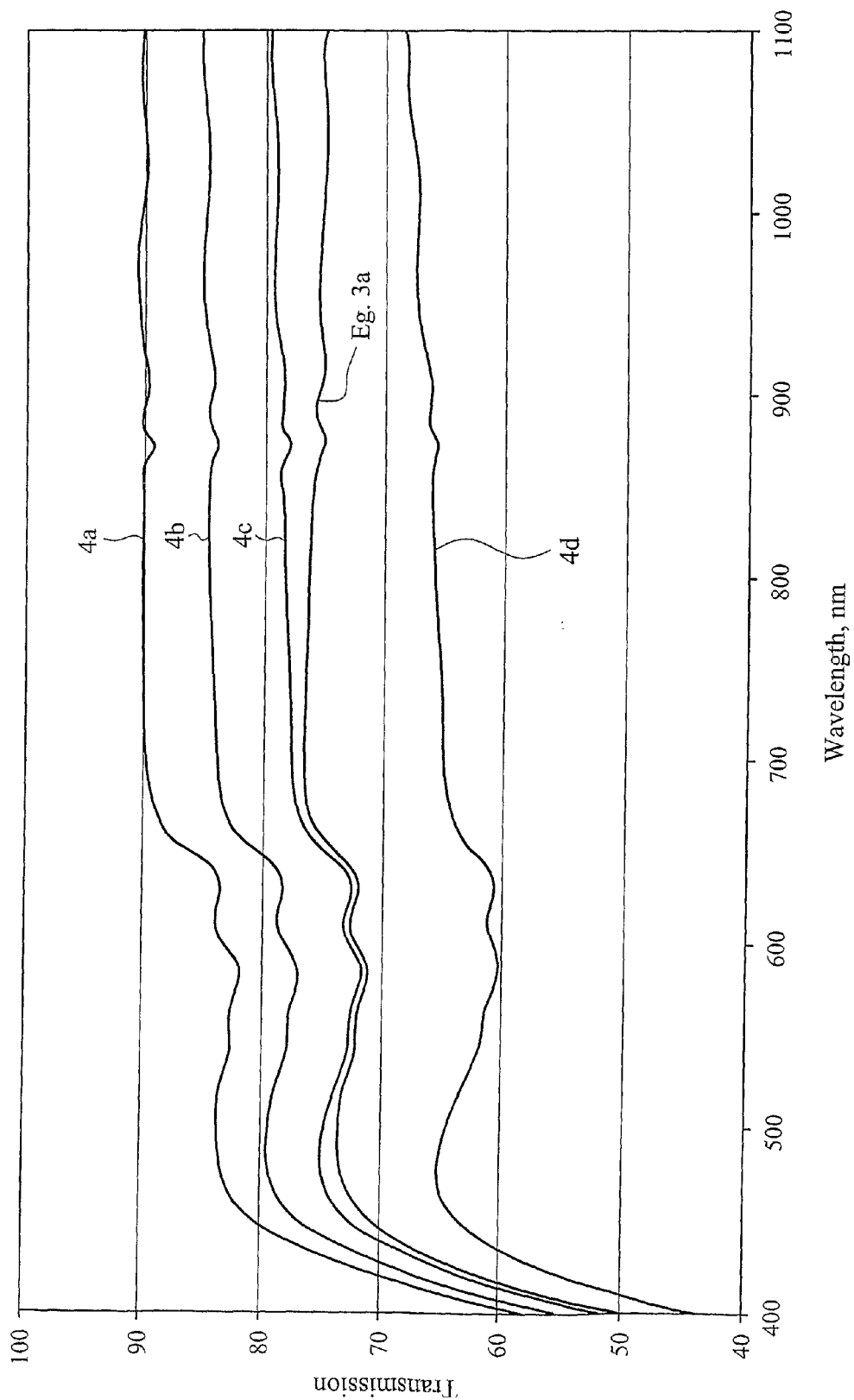
FIG. 5 includes plots of transmission vs. wavelength for various materials.

Referring to FIG. 5, it will be noted that the Example 3a material has reducing transmission/increasing absorbance across the IR region as the wavelength increases. Although the Example 4d material appears to have higher absorbance than the Example 3a material, the former material was present at a significantly higher level in the PET compared to the level for Example 3a material.

Referring to FIG. 6, the significant difference between absorbances of Examples 5b and 5c materials will be noted when the effect of the PET is subtracted. It will be appreciated that the Example 5b material has significantly increasing absorbance across the IR region as the wavelength increases.

It will be noted by comparing Examples 3a and 3b in FIG. 4 that the spectra of the materials in the visible region are very similar and the absorbance in the visible region for the two materials are similar. However, the absorbance of the Example 3a material in the IR region is significantly higher than for the Example 3b material. This means that for the same effect on clarity (e.g. L*) as the Example 3b material, the Example 3a material will provide a higher level of reheat. Alternatively, to achieve the same level of reheat as the Example 3b material, the amount of Example 3a material can be reduced (relative to the level used in the materials analysed in FIG. 4) which will result in lower absorbance/higher transmission in the visible region and consequently increased clarity.

The invention claimed is:

1. An article comprising a polymer composition which includes a reheat additive wherein said article includes at least one of the following properties:
   (A) the ratio defined as the absorbance at 750 nm divided by the absorbance at 700 nm is greater than 1;
   (B) the ratio defined as the absorbance at 800 nm divided by the absorbance at 700 nm is greater than 1;
   (C) the ratio defined as the absorbance at 850 nm divided by the absorbance at 700 nm is greater than 1;
   (D) the ratio defined as the absorbance at 900 nm divided by the absorbance at 700 nm is greater than 1;
   (E) the ratio defined as the absorbance at 950 nm divided by the absorbance at 700 nm is greater than 1;
   (F) the ratio defined as the absorbance at 1000 nm divided by the absorbance at 700 nm is greater than 1;
   (G) the ratio defined as the absorbance at 1050 nm divided by the absorbance at 700 nm is greater than 1;
   (H) the ratio defined as the absorbance at 1100 nm divided by the absorbance at 700 nm is greater than 1;
   (I) the ratio defined as the transmission at 1000 nm divided by the transmission at 500 nm is less than 1.04;
   (J) the % transmission at 1000 nm minus the % transmission at 500 nm is less than 2.75%.

2. An article according to claim 1, wherein said article includes at least 3 of properties (E) to (H).

3. An article according to claim 1, wherein said article includes at least 4 of properties (A) to (H).

4. An article according to claim 1 wherein said article includes property (H).

5. An article according to claim 1, wherein the ratio for property (A) is lower than the ratio for property (B) which is lower than the ratio for property (C) which is lower than the ratio for property (B) which is lower than the ratio for property (E) which is lower than the ratio for property (F) which is lower than the ratio for property (G).

6. An article according to claim 1, wherein said article includes each of properties (A) to (J).

7. An article according to claim 1, wherein the ratio of the absorbance in the region 701 nm-1100 nm divided by the absorbance in the region 450-700 nm is at least 1.1.

8. An article according to claim 1, wherein said article is a bottle or a preform for a bottle.

9. An article according to claim 1, wherein said article has an L* measured on the CIELab scale of at least 65.

10. An article according to claim 1, wherein said reheat additive includes titanium moieties and nitrogen moieties.

11. An article according to claim 1, wherein said reheat additive includes particles having at least one dimension less than 10 microns.

12. An article according to claim 1, wherein said polymer composition includes at least 0.01 ppm and less than 200 ppm of said reheat additive based on the weight of said polymer composition.

13. An article according to claim 1, wherein said reheat additive is made by a physical vapour deposition technique.

14. An article according to claim 1, wherein said reheat additive has a structure selected from porous columnar, dense columnar and fully dense.

15. A polymer composition for an article as described in claim 1, the polymer composition, when moulded into a 3 mm thickness plaque, having at least one of properties (A) to (J).

16. An article according to claim 1, wherein said article includes at least one of the following properties:
   (AA) the ratio defined as the absorbance at 900 nm divided by the absorbance at 850 nm is greater than 1;
   (BB) the ratio defined as the absorbance at 950 nm divided by the absorbance at 850 nm is greater than 1;
   (CC) the ratio define as the absorbance at 1000 nm divided by the absorbance at 850 nm is greater than 1;
   (DD) the ratio defined as the absorbance at 1050 nm divided by the absorbance at 850 nm is greater than 1;
   (EE) the ratio defined as the absorbance at 1100 nm divided by the absorbance at 850 nm is greater than 1.

17. An article according to claim 1, wherein said reheat additive includes titanium moieties and nitrogen moieties, wherein the ratio of the number of atoms of titanium to the number of atoms of nitrogen in the additive is greater than 1 and is less than 1.9.

* * * * *